US012568855B2

(12) United States Patent
Kim et al.

(10) Patent No.: US 12,568,855 B2
(45) Date of Patent: Mar. 3, 2026

(54) DISPLAY MODULE

(71) Applicant: SAMSUNG ELECTRONICS CO., LTD., Suwon-si (KR)

(72) Inventors: Myunghee Kim, Suwon-si (KR); Youngki Jung, Suwon-si (KR); Donghwan Kim, Suwon-si (KR); Yong Namkung, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 506 days.

(21) Appl. No.: 17/723,034

(22) Filed: Apr. 18, 2022

(65) Prior Publication Data

US 2022/0238503 A1 Jul. 28, 2022

Related U.S. Application Data

(63) Continuation of application No. PCT/KR2021/014142, filed on Oct. 13, 2021.

(30) Foreign Application Priority Data

Oct. 19, 2020 (KR) ........................ 10-2020-0134891
Mar. 29, 2021 (KR) ........................ 10-2021-0040332

(51) Int. Cl.
*H01L 25/16* (2023.01)
*H01L 23/00* (2006.01)
*H10H 20/85* (2025.01)

(52) U.S. Cl.
CPC ............ *H01L 25/167* (2013.01); *H01L 24/02* (2013.01); *H01L 24/05* (2013.01); *H01L 24/06* (2013.01);
(Continued)

(58) Field of Classification Search
CPC ......... H01L 24/02; H01L 24/05; H01L 24/06; H01L 24/08; H01L 24/24; H01L 24/32;
(Continued)

(56) References Cited

U.S. PATENT DOCUMENTS 7,714,341 B2    5/2010   Chil Keun et al.
7,847,049 B2    12/2010  Ito et al.
(Continued)

FOREIGN PATENT DOCUMENTS

CN         211265477 U      8/2020
EP         1 710 269 A1     10/2006
(Continued)

OTHER PUBLICATIONS

Seungmin Lee et al., "A discrete core-shell-like micro-light-emitting diode array grown on sapphire nano-membranes", Scientific Reports, 10, 7506, May 2020, 11 pages total.
(Continued)

*Primary Examiner* — Teresa M. Arroyo
(74) *Attorney, Agent, or Firm* — Sughrue Mion, PLLC

(57) ABSTRACT

A display module is disclosed. The display module includes a substrate; a plurality of inorganic light-emitting diodes provided in a plurality of mounting grooves formed in the substrate, the plurality of inorganic light-emitting diodes including an inorganic light-emitting diode that has a first chip electrode and a second chip electrode; a first substrate electrode pad and a second substrate electrode pad provided at a bottom surface of a mounting groove from among the plurality of mounting grooves, the first substrate electrode pad being electrically coupled to the first chip electrode and the second substrate electrode pad being electrically coupled to the second chip electrode; and a third substrate electrode pad and a fourth substrate electrode pad provided around the mounting groove.

16 Claims, 11 Drawing Sheets

(52) U.S. Cl.
CPC .............. *H01L 24/08* (2013.01); *H01L 24/24* (2013.01); *H01L 24/32* (2013.01); *H01L 24/33* (2013.01); *H01L 24/95* (2013.01); *H01L 2224/02377* (2013.01); *H01L 2224/02381* (2013.01); *H01L 2224/05548* (2013.01); *H01L 2224/05558* (2013.01); *H01L 2224/05573* (2013.01); *H01L 2224/0603* (2013.01); *H01L 2224/06102* (2013.01); *H01L 2224/08147* (2013.01); *H01L 2224/24147* (2013.01); *H01L 2224/32145* (2013.01); *H01L 2224/33181* (2013.01); *H01L 2224/95101* (2013.01); *H01L 2224/95144* (2013.01); *H10H 20/85* (2025.01)

(58) Field of Classification Search
CPC .................... H01L 24/33; H01L 24/95; H01L 2224/06102; H01L 2224/08147; H01L 2224/24147; H01L 2224/32145; H01L 2224/33181; H01L 2224/95101; H01L 2224/95144; H01L 2224/95085; H01L 2224/95; H01L 2224/95136; H01L 2224/02377; H01L 2224/02381; H01L 2224/05548; H01L 2224/05558; H01L 2224/05573; H01L 2224/0603; H01L 24/81; H01L 25/0753; H01L 25/167; H01L 21/52; H01L 27/12; H01L 33/00; H01L 33/62; H01L 33/48
See application file for complete search history.

(56) References Cited

U.S. PATENT DOCUMENTS

| | | |
|---|---|---|
| 8,314,439 B2 | 11/2012 | Tan et al. |
| 8,642,363 B2 | 2/2014 | Lau et al. |
| 8,648,328 B2 | 2/2014 | Crowder et al. |
| 8,865,489 B2 | 10/2014 | Rogers et al. |
| 9,119,332 B2 | 8/2015 | Tomoda |
| 9,582,036 B2 | 2/2017 | Bibl et al. |
| 9,711,680 B2 | 7/2017 | Park et al. |
| 9,773,761 B2 | 9/2017 | Do |
| 10,153,256 B2 | 12/2018 | Cok et al. |
| 10,431,718 B2 | 10/2019 | Crowder et al. |
| 10,580,350 B2 | 3/2020 | Lee et al. |
| 10,811,403 B2 | 10/2020 | Sasaki et al. |
| 11,227,853 B2 | 1/2022 | Israel et al. |
| 2008/0006837 A1* | 1/2008 | Park ...................... H01L 33/486 |
| | | 257/E33.072 |
| 2013/0134470 A1 | 5/2013 | Shin |
| 2016/0300989 A1* | 10/2016 | Kawano .................. H01L 24/48 |
| 2016/0351092 A1* | 12/2016 | Chen .................. H10H 20/857 |
| 2017/0309604 A1* | 10/2017 | Kim .................... H10H 20/856 |
| 2017/0358505 A1 | 12/2017 | Chang et al. |
| 2018/0294254 A1* | 10/2018 | Chen ...................... H01L 33/62 |
| 2019/0058080 A1 | 2/2019 | Ahmed et al. |
| 2019/0148611 A1 | 5/2019 | He et al. |
| 2019/0181304 A1 | 6/2019 | Sasaki et al. |
| 2019/0296184 A1 | 9/2019 | Ahmed et al. |
| 2019/0304950 A1 | 10/2019 | Israel et al. |
| 2019/0355708 A1 | 11/2019 | Sasaki et al. |
| 2020/0035879 A1 | 1/2020 | Sasaki et al. |
| 2020/0075666 A1* | 3/2020 | Kawaguchi .......... H10D 84/858 |
| 2020/0168589 A1 | 5/2020 | Kim et al. |
| 2020/0203321 A1 | 6/2020 | Choi et al. |
| 2020/0212267 A1* | 7/2020 | Kwak ..................... H01L 33/24 |
| 2020/0212336 A1* | 7/2020 | Heo ........................ H10K 59/35 |
| 2020/0219779 A1* | 7/2020 | Yen ..................... H01L 25/0753 |
| 2020/0235128 A1 | 7/2020 | Shin et al. |
| 2020/0251638 A1* | 8/2020 | Morris .................. H01L 24/08 |
| 2020/0395345 A1 | 12/2020 | Park et al. |
| 2021/0098278 A1* | 4/2021 | Chen .................. H01L 33/0095 |

FOREIGN PATENT DOCUMENTS

| | | |
|---|---|---|
| JP | 2011-233733 A | 11/2011 |
| JP | 5824156 B2 | 11/2015 |
| JP | 2019-140363 A | 8/2019 |
| KR | 10-2008-0004931 A | 1/2008 |
| KR | 10-2013-0059104 A | 6/2013 |
| KR | 10-1490758 B1 | 2/2015 |
| KR | 10-2019-0009003 A | 1/2019 |
| KR | 10-2019-0075869 A | 7/2019 |
| KR | 10-2019-0092516 A | 8/2019 |
| KR | 10-2020-0023316 A | 3/2020 |
| KR | 10-2020-0026673 A | 3/2020 |
| KR | 10-2020-0026778 A | 3/2020 |
| KR | 10-2020-0078060 A | 7/2020 |
| KR | 10-2020-0091347 A | 7/2020 |
| WO | 2005/052026 A1 | 6/2005 |

OTHER PUBLICATIONS

Yun Jae Eo et al., "Enhanced DC-operated electroluminescence of forwardly aligned p/MQW/n InGaN nanorod LEDs via DC offset-AC dielectrophoresis", ACS Applied Materials & Interfaces, DOI: 10.1021/acsami.7b09794, Oct. 2017, 34 pages total.

Hoo Keun Park et al., "Horizontally assembled green InGaN nanorod LEDs: scalable polarized surface emitting LEDs using electric-field assisted assembly", Scientific Reports, 6, 28312, DOI: 10.1038/srep28312, Jun. 2016, 9 pages total.

Junseok Jeong et al., "Remote heteroepitaxy of GaN microrod heterostructures for deformable light-emitting diodes and wafer recycle", Science Advances, 6, eaaz5180, DOI: 10.1126/sciadv. aaz5180, Jun. 2020, 10 pages total.

Won Woo Chung et al., "Fabrication of an InGaN/GaN-based LED Nanorod Array by Nanosphere Lithography and its Optical Properties", Proceedings of the 15th IEEE International Conference on Nanotechnology, Jul. 2015, 4 pages total.

Ju Seung Lee et al., "Nanoscale-Dewetting-Based Direct Interconnection of Microelectronics for a Deterministic Assembly of Transfer Printing", Advanced Materials, 32, 1908422, DOI: 10.1002/adma.201908422, 2020, 11 pages total.

International Search Report dated Jan. 28, 2022 issued by the International Searching Authority in counterpart International Application No. PCT/KR2021/014142 (PCT/ISA/210).

International Written Opinion dated Jan. 28, 2022 issued by the International Searching Authority in counterpart International Application No. PCT/KR2021/014142 (PCT/ISA/237).

Communication dated Nov. 8, 2023, issued by the European Patent Office in counterpart European Application No. 21883109.7.

Communication issued on Aug. 7, 2025 by the Korean Intellectual Property Office in Korean Patent Application No. 10-2021-0040332.

* cited by examiner

DISPLAY MODULE

CROSS-REFERENCE TO RELATED APPLICATIONS

This application is a bypass continuation of International Application No. PCT/KR2021/014142, filed on Oct. 13, 2021, which is based on and claims priority to Korean Patent Application No. 10-2020-0134891, filed on Oct. 19, 2020, in the Korean Intellectual Property Office, and Korean Patent Application No. 10-2021-0040332, filed on Mar. 29, 2021, in the Korean Intellectual Property Office, the disclosures of which are incorporated by reference herein in their entireties.

BACKGROUND

1. Field

The disclosure relates to a display module manufactured through a fluidic self-assembly method.

2. Description of Related Art

The disclosure relates to a fluidic self-assembly method of transferring a light-emitting device in fluid to a mounting position on a substrate. The fluidic self-assembly method allows an ultra-small self-light-emitting device, such as a micro LED or a nano wire, to be transferred to a large area substrate.

The substrate used in the fluidic self-assembly method may be provided with multiple mounting grooves to which light-emitting devices are inserted. A pair of substrate electrode pads may be provided in the bottom of the mounting groves, and an anode electrode and a cathode electrode of the light-emitting device may be connected thereto.

Faulty light-emitting devices that have been transferred to the substrate may be identified during an inspection process, and may be removed from the mounting grooves and substituted with normal light-emitting devices. However, if the pair of substrate electrode pads disposed at the bottom of the mounting grooves are damaged when the faulty light-emitting devices are separated from the mounting grooves, it may be difficult to mount the replacement light-emitting devices.

SUMMARY

One or more embodiments may address at least the above-mentioned problems and/or disadvantages and may provide at least the advantages described below. Accordingly, in accordance with an aspect of the disclosure, a display module in which faulty micro-LEDs have been transferred by a fluidic self-assembly may be repaired.

According to embodiments of the disclosure, a display module includes: a substrate; a plurality of inorganic light-emitting diodes provided in a plurality of mounting grooves formed in the substrate, the plurality of inorganic light-emitting diodes comprising an inorganic light-emitting diode that has a first chip electrode and a second chip electrode; a first substrate electrode pad and a second substrate electrode pad provided at a bottom surface of a mounting groove from among the plurality of mounting grooves, the first substrate electrode pad being electrically coupled to the first chip electrode and the second substrate electrode pad being electrically coupled to the second chip electrode; and a third substrate electrode pad and a fourth substrate electrode pad provided around the mounting groove.

At least one of the third substrate electrode pad and the fourth substrate electrode pad extends along a side wall of the mounting groove.

The third substrate electrode pad and the fourth substrate electrode pad may be symmetrically provided with respect to a center of the mounting groove.

The third substrate electrode pad and the fourth substrate electrode pad may be asymmetrically provided with respect to a center of the mounting groove.

The substrate may include an insulating layer provided on the third substrate electrode pad and the fourth substrate electrode pad.

The third substrate electrode pad may be electrically coupled to the first chip electrode by a first conductor, and the fourth substrate electrode pad may be electrically coupled to the second chip electrode of the inorganic light-emitting diode by a second conductor.

A post may be provided on a light-emitting surface of the inorganic light-emitting diode, and the post may include a magnetic layer.

The magnetic layer may be formed of Germanium (Ge).

The post may be offset from a center of the light-emitting surface.

The post may be provided at a position corresponding to one of the first chip electrode and the second chip electrode.

The plurality of mounting grooves include another mounting groove adjacent to the mounting groove.

A fifth substrate electrode pad and a sixth substrate electrode pad may be provided at a bottom surface of the another mounting groove.

The first substrate electrode pad may be electrically coupled to the fifth substrate electrode pad, and the second substrate electrode pad may be electrically coupled to the sixth substrate electrode pad.

According to embodiments of the disclosure, a display module includes: a substrate; a thin-film transistor (TFT) layer provided on the substrate, a plurality of mounting grooves being provided in the TFT layer; a plurality of inorganic light-emitting diodes provided in the plurality of mounting grooves, the plurality of inorganic light-emitting diodes comprising an inorganic light-emitting diode that has a first chip electrode and a second chip electrode; a first substrate electrode pad and a second substrate electrode pad provided at a bottom surface of a mounting groove from among the plurality of mounting grooves, the first substrate electrode pad being electrically coupled to the first chip electrode and the second substrate electrode pad being electrically coupled to the second chip electrode; and a third substrate electrode pad and a fourth substrate electrode pad provided on a side wall of the mounting groove. The first substrate electrode pad and the third substrate electrode pad may are electrically coupled to a first electrode wiring provided on the TFT layer, and the second substrate electrode pad and the fourth substrate electrode pad are electrically coupled to a second electrode wiring provided on the TFT layer.

The display module may further include an insulating layer covering the third substrate electrode pad and the fourth substrate electrode pad.

Another mounting groove from among the plurality of mounting grooves may be adjacent the mounting groove, and a fifth substrate electrode pad and a sixth substrate electrode pad may be provided at a bottom surface of the another mounting groove.

The first substrate electrode pad may be electrically coupled to the fifth substrate electrode pad, and the second substrate electrode pad may be electrically coupled to the sixth substrate electrode pad.

According to embodiments of the disclosure, a display module includes: a substrate; a first substrate electrode pad and a second substrate electrode pad provided in a first groove of the substrate; an inorganic light-emitting diode provided in the first groove and electrically connected to the first substrate electrode pad and the second substrate electrode pad; a third substrate electrode pad provided on the substrate and electrically connected to the first substrate electrode pad; and a fourth substrate electrode pad provided on the substrate and electrically connected to the second substrate electrode pad.

The third substrate electrode pad may be provided on an upper surface of the substrate and extend along a side wall of the first groove.

The third substrate electrode pad may be provided on an upper surface of the substrate, and may extend along a side wall of the first groove and a side wall of a second groove adjacent the first groove.

The display module may further include an insulating layer provided in the first groove between the inorganic light-emitting diode and the third substrate electrode pad.

The display module may further include a gate electrode wiring provided in the second groove adjacent the first groove.

The display module may further include a common electrode wiring provided in a third groove adjacent the first groove.

The third substrate electrode pad and the fourth substrate electrode pad may be provided in a fourth groove adjacent the second groove.

The display module may further include an insulator filling the fourth groove and covering the third substrate electrode pad and the fourth substrate electrode pad.

BRIEF DESCRIPTION OF THE DRAWINGS

The above and/or other aspects will be more apparent by describing certain embodiments, with reference to the accompanying drawings, in which.

DETAILED DESCRIPTION

Figure 1:
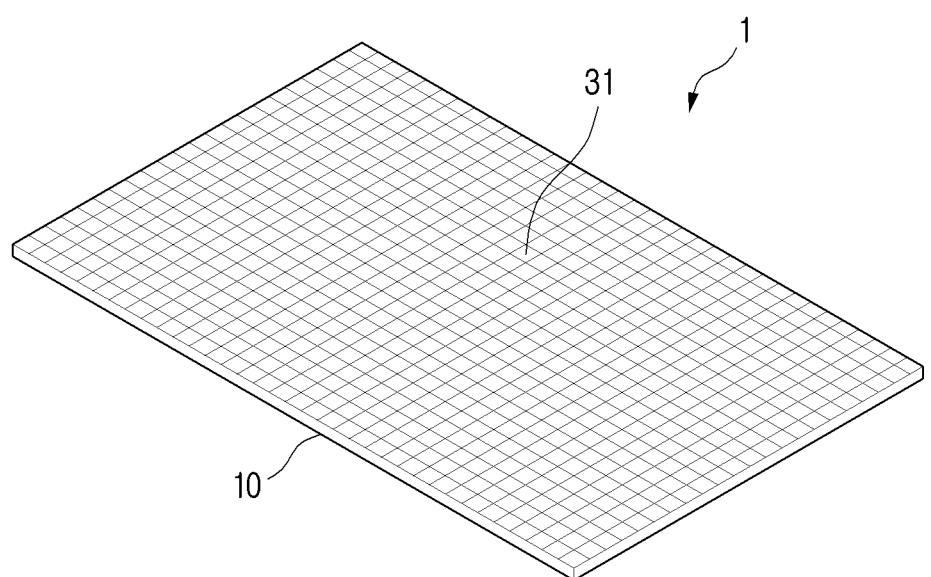
FIG. 1 is a perspective view illustrating a display module according to an embodiment.

Various embodiments of the disclosure will be described herein in greater detail with reference to the accompanying drawings. The embodiments described herein may be variously modified. Specific embodiments may be illustrated in the drawings and described in detail in the description. However, the specific embodiments described in the accompanied drawings are merely to assist in the understanding of the various embodiments. Accordingly, the various embodiments are not for limiting the scope of the disclosure to a specific embodiment, and should be interpreted to include all modifications, equivalents and/or alternatives of the embodiments.

As used herein, the terms "1st" or "first" and "2nd" or "second" may use corresponding components regardless of importance or order and are used to distinguish a component from another without limiting the components. Further, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It is to be understood that the terms such as "comprise" or "include" are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being "coupled with/to" or "connected to" another element, it may be understood as the certain element being directly coupled with/to another element or as being coupled through other element. On the other hand, when a certain element is indicated as "directly coupled with/to" or "directly connected to" another element, it may be understood as the other element not being present between the certain element and another element.

In the disclosure, the expression "same" may not only mean fully matching, but also include a difference to a degree taking into consideration a processing error range.

In addition thereto, in describing the disclosure, in case it is determined that the detailed description of related known technologies may unnecessarily confuse the gist of the disclosure, the detailed description thereof will be abridged or omitted.

In the disclosure, a display module may be a flat panel display panel that includes micro LEDs, which are light-emitting diodes of less than or equal to 100 μm. The display module that includes the micro LEDs may provide a better contrast, response time, and energy efficiency than a liquid crystal display (LCD) panel which requires a backlight. A micro LED may be formed of inorganic material and may be brighter, have better light-emitting efficiency, and longer lifespan than an organic light emitting diode (OLED). The micro LED may be a semiconductor chip capable of emitting light on its own when power is provided, and may exhibit a fast response rate, a low power, and high brightness. Specifically, the micro LED exhibits higher efficiency in converting electricity to photons compared to LCDs or OLEDs. That is, the micro LED exhibits a higher "brightness per watt" compared to LCD or OLED displays. Accordingly, the micro LED may be configured to exhibit the same brightness with about half of the energy compared to larger LEDs (width, height, and depth exceeding 100 μm, respectively) or OLEDs. In addition to the above, the micro LEDs may realize a high resolution, superior color, contrast and brightness, represent a wide range of colors accurately, and realize a clear screen even in the outdoors. Further, the micro LEDs formed of inorganic material are resistant against a burn in phenomenon and have low heat generation, thereby providing a long lifespan.

The micro LED may be a vertical-type micro LED of which a pair of electrodes (an anode electrode and a cathode electrode) are respectively disposed at a light-emitting surface and an opposite surface of the light-emitting surface. The micro LED may also be a flip-type micro LED of which the pair of electrodes are disposed at an opposite surface of the light-emitting surface.

The micro LED may include a post having a magnetic layer to facilitate insertion of the micro LED into the mounting groove by a magnetic field applied when performing the fluidic self-assembly. The post may protrude from the light-emitting surface of the micro LED by a predetermined length. The magnetic layer included in the post may include diamagnetic materials (Diamagnetism; e.g., Ge) or materials having magnetic-field characteristics (e.g., Cr, Mn, Fe, Co, Ni, Cu).

A substrate may include multiple pixel areas arranged in matrix form at a front surface. Multiple sub pixels disposed at one pixel area may form one pixel. For example, one of the pixel areas may include three sub pixels. The three sub pixels may be formed of micro LEDs capable of expressing red (R), green (G) and blue (B) colors, respectively.

The substrate may be configured such that a TFT layer on which a thin film transistor (TFT) circuit is formed is disposed at the front surface, and a circuit configured to provide power to the TFT circuit and electrically couple with a separate control substrate may be disposed at a rear surface.

The substrate may be formed with multiple mounting grooves to which multiple micro LEDs are mounted. At the bottom of the respective mounting grooves, a pair of substrate electrode pads may be disposed, and at a side wall and surrounding part of the respective mounting grooves, the pair of substrate electrode pads for the repair of the faulty micro LED may be formed.

The substrate may further include an auxiliary mounting groove for mounting the micro LED for repair when the faulty micro LED is to be used without removing it from the mounting groove. The auxiliary mounting groove may be disposed with the pair of substrate electrode pads at the bottom. The auxiliary mounting groove may be filled with an insulating material up to a height corresponding to the front surface of the substrate. The micro LED for repair may be mounted in the auxiliary mounting groove after removing the insulating material.

The mounting groove and the auxiliary mounting groove of the substrate may each be formed of a shape corresponding to a shape of the micro LED (e.g., a cube, a cuboid, a circle, an oval, etc.).

Multiple side surface wirings may be formed in an edge area of the substrate, and be spaced apart from each other at a certain distance. The multiple side surface wirings may be configured such that one end part is electrically coupled with multiple first connection pads formed at the edge area included in the front surface of the substrate, and the other end part is electrically coupled with multiple second connection pads formed at the edge area included in the rear surface of the substrate. The multiple first connection pads may be coupled with the TFT circuit provided at the TFT layer through wiring, and the multiple second connection pads may be coupled with a driving circuit disposed at the rear surface of the substrate through wiring.

The display module may be configured to realize, based on forming multiple side surface wirings, a bezel-less display module by minimizing a dummy area at the front surface of the substrate and maximizing an active area, and a mounting density of micro LEDs with respect to the display module may be increased. Accordingly, the bezel-less display module may provide a large format display device by coupling multiple display modules together. In this case, the respective display modules may be formed to maintain a pitch between the respective pixels of adjacent display modules by minimizing the dummy area of the adjacent display modules to be the same as a pitch between the respective pixels in a single display module. Accordingly, a seam appearing at a coupling part between the respective display modules may be prevented.

The side surface wirings may be formed in plurality with a certain distance therebetween at respective edge areas corresponding to two sides of the substrate that face each other from among the edge areas corresponding to four surfaces of the substrate. However, embodiments are not limited thereto, and the side surface wirings may be formed in plurality with a certain distance therebetween at the edge areas corresponding to two sides of the substrate that are adjacent to each other. In addition, the side surface wirings may be formed in plurality with a certain distance therebetween only at a single edge area corresponding to one side from among the edge areas or may be formed in plurality with a certain distance therebetween at the edge areas corresponding to the three sides.

The display module may be installed and applied to a wearable device, a portable device, a handheld device, an electronic product requiring various displays or electrical fields as a single unit, and may be applied to a display device such as a monitor for a personal computer (PC), a high resolution television (TV), a signage (or, digital signage), an electronic display and the like through a plurality of assembly arrangements as a matrix-type.

Figure 2:
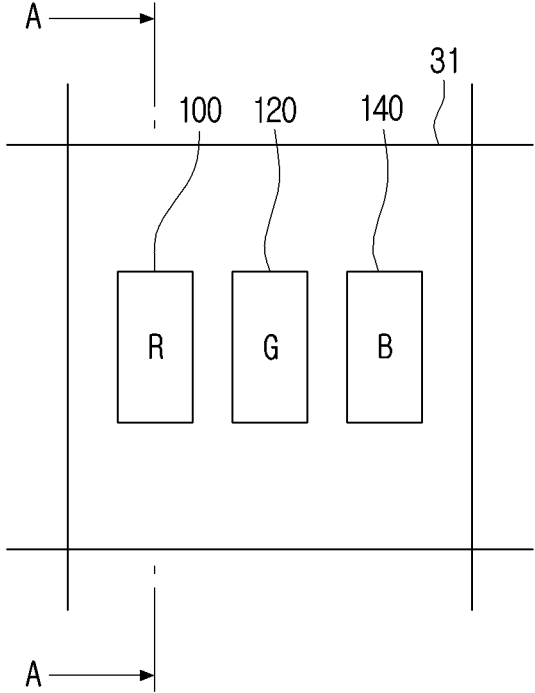
FIG. 2 is an enlarged view illustrating a pixel area of the display module shown in FIG. 1 according to an embodiment.
Figure 3:
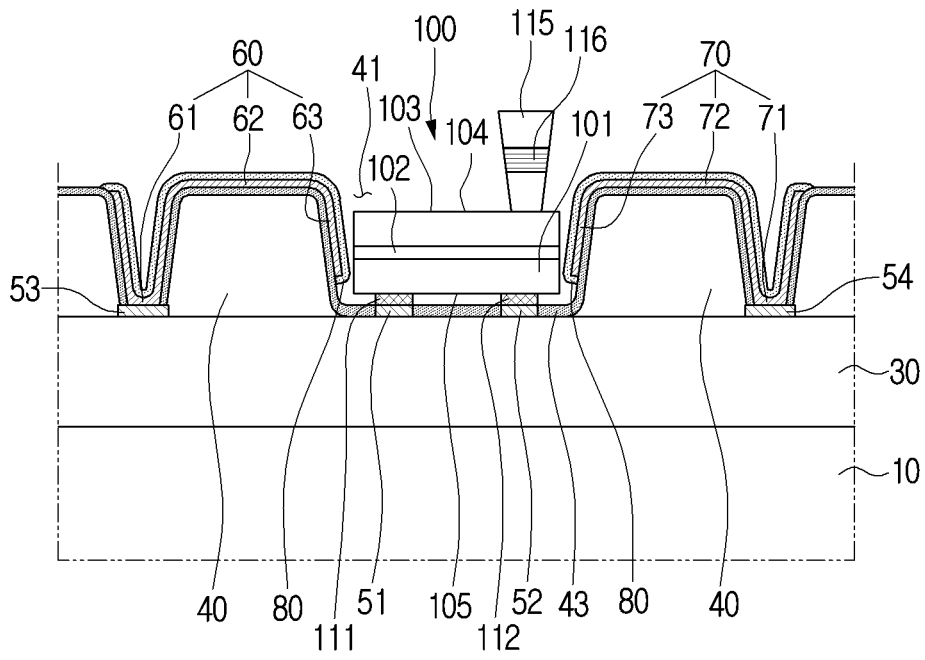
FIG. 3 is a cross-sectional view taken along line A-A shown in FIG. 2 according to an embodiment.

FIG. 1 is a perspective view illustrating the display module according to an embodiment, FIG. 2 is an enlarged view illustrating the pixel area of the display module shown in FIG. 1, and FIG. 3 is a cross-sectional view taken along line A-A shown in FIG. 2.

Referring to FIG. 1 and FIG. 3, the display module 1 according to an embodiment may include a substrate 10, and multiple light-emitting devices 100 mounted to the substrate 10.

The TFT layer 30, which includes the TFT circuit, may be disposed at the front surface of the substrate 10. A driver integrated circuit (IC) for controlling the TFT circuit may be disposed at the rear surface of the substrate 10.

The front surface of the substrate 10 may include an active area which corresponds to an image area, and a dummy area which does not emit light. The active area may be divided into multiple pixel areas 31 to which multiple pixels are disposed, respectively. The dummy area may be included in the edge area of the substrate 10.

The TFT circuit and the driver IC may be electrically coupled through multiple VIA wirings formed in multiple VIA holes formed through the substrate 10, or electrically coupled through multiple side surface wirings formed along the edge area of the substrate 10. For example, the substrate 10 may be a glass substrate or a synthetic resin substrate. In case the substrate 10 is a synthetic resin substrate, the TFT circuit and the driver IC may be electrically coupled through VIA wirings. In addition, it is difficult to form the VIA hole through a glass substrate compared to the synthetic resin substrate. Therefore, in case the substrate 10 is a glass substrate, the TFT circuit and the driver IC may be electrically coupled through side surface wirings.

A pixel driving method of the display module 1 according to an embodiment may be an active matrix (AM) driving method or a passive matrix (PM) driving method. The display module 1 may include a pattern of wiring which electrically connects the respective micro LEDs according to the AM driving method or the PM driving method.

Referring to FIG. 2, the respective pixel areas 31 may be disposed with micro LEDs 100, 120 and 140 which act as multiple sub pixels. The micro LED 100 may be configured to emit a red light, the micro LED 120 may be configured to emit a green light, and the micro LED 140 may be configured to emit a blue light which are disposed to one pixel area form one pixel. Although it has been described as three sub pixels forming one pixel, embodiments are not limited thereto, and, for example, two sub pixels emitting different colors may form one pixel, or four sub pixels emitting different colors may form one pixel.

The display module 1 may be configured such that multiple micro LEDs are mounted by the fluidic self-assembly method. To this end, multiple mounting grooves 41 to which multiple micro LEDs may be inserted are provided on the TFT layer 30 of the substrate 10.

Referring to FIG. 2 and FIG. 3, at least two or more multiple mounting grooves 41 may be formed with respect to the one pixel area. For example, the number of mounting grooves 41 provided in one pixel area may correspond to the number of micro LEDs disposed to one pixel area. As in FIG. 2, three mounting grooves may be provided so that three micro LEDs 100, 120 and 140 may be mounted to one pixel area 31.

The mounting groove 41 may be formed through an insulating layer 40 formed on the TFT layer 30. The insulating layer 40 may be formed of an organic material or an inorganic material. A protective film 43 may be provided on the insulating layer 40.

The mounting groove 41 may be formed at a predetermined depth. The micro LED 100 inserted into the mounting groove 41 may be configured such that a post 115 of the micro LED 100 protrudes outside of the mounting groove 41. For example, the post 115 may vertically extend past an upper surface of the insulating layer 40.

The mounting groove 41 may be configured such that a first substrate electrode pad 51 and a second substrate electrode pad 52 are disposed at the bottom thereof. In this case, the bottom of the mounting groove 41 may be a top surface of the TFT layer 30.

The first substrate electrode pad 51 may be connected with a first chip electrode 111 of the micro LED 100. A solder ball or a solder past may be applied on the first substrate electrode pad 51 so that an electric connection and a physical connection may be formed. Accordingly, the first substrate electrode pad 51 may be configured such that the first chip electrode 111 of the micro LED 100 is electrically and physically coupled to the first chip electrode 111 through the solder ball or the solder paste.

The second substrate electrode pad 52 may be connected with a second chip electrode 112 of the micro LED 100. The second substrate electrode pad 52 may be electrically and physically coupled with the second chip electrode 112 of the micro LED 100 in the same connection method as the first substrate electrode pad 51.

The first substrate electrode pad 51 may be, for example, electrically coupled to a gate electrode wiring 53 provided on the TFT layer 30. In this case, the second substrate electrode pad 52 may be electrically coupled to a common electrode wiring 54 provided on the TFT layer 30.

A third substrate electrode pad 60 and a fourth substrate electrode pad 70 corresponding to respective mounting grooves 41 may be formed on the substrate 10 so that the micro LEDs for repair may be electrically coupled. The third substrate electrode pad 60 and the fourth substrate electrode pad 70 may be substrate electrode pads for repair.

The third substrate electrode pad 60 may be formed on the insulating layer 40. The third substrate electrode pad 60 may be configured such that a first part (i.e., first conductor) 61 is electrically coupled with the gate electrode wiring 53, a second (i.e., second conductor) part 62 is disposed at a surrounding part of the mounting groove 41, and a third part (i.e., third conductor) 63 extends from the second part 62 to the side wall of the mounting groove 41.

The second part 62 and the third part 63 of the third substrate electrode pad 60 may be used selectively according to the type or form of the micro LED for repair. For example, the second part 62 or the third part 63 of the third substrate electrode pad 60 may be used taking into consideration the position of the first chip electrode of the micro LED for repair.

The fourth substrate electrode pad 70 may be formed on the insulating layer 40 as with the third substrate electrode pad 60. In this case, the fourth substrate electrode pad 70 may be disposed symmetrically with the third substrate electrode pad 60 based on a center of the mounting groove 41.

The fourth substrate electrode pad 70 may be configured such that a first part (i.e., first conductor) 71 is electrically coupled with the common electrode wiring 54, a second part (i.e., second conductor) 72 is disposed at the surrounding part of the mounting groove 41, and a third part (i.e., third conductor) 73 extends from the second part 72 to the side wall of the mounting groove 41.

The fourth substrate electrode pad 70 may be configured such that the second part 72 and the third part 73 are used selectively according to the type or form of the micro LED for repair as with the third substrate electrode pad 60. For example, the second part 72 or the third part 73 of the fourth substrate electrode pad 70 may be used taking into consideration the position of the second chip electrode of the micro LED for repair.

The third and fourth substrate electrode pads 60 and 70 may be covered by an insulating layer 80 so as to prevent undesired electrical coupling with another electronic device or the like when not in use.

When using the third and fourth substrate electrode pads 60 and 70 to connect the micro LED for repair to the substrate 10, a part of the insulating layer 80 may be removed to expose a part of the third and fourth substrate electrode pads 60 and 70.

The micro LED 100 may be a flip-type micro LED in which a p-type semiconductor layer 101, an active layer 102, and an n-type semiconductor layer 103 are sequentially stacked, and the first and second chip electrodes 111 and 112 are disposed at an opposite surface 105 of the light-emitting surface 104. However, the micro LED 100 is not limited to the flip-type micro LED and may be a vertical-type micro LED.

The micro LED 100 may include a post 115 having a magnetic layer 116 to facilitate insertion of the micro LED into the mounting groove 41 by a magnetic field applied to the substrate 10 when performing the fluidic self-assembly.

The post 115 may protrude by a predetermined length from the light-emitting surface 104 of the micro LED 100. The magnetic layer included in the post 115 may include diamagnetic materials (Diamagnetism; e.g., Ge) or materials having magnetic-field characteristics (e.g., Cr, Mn, Fe, Co, Ni, Cu).

The post 115 may be positioned on the light-emitting surface 104, and disposed biased to one side of the light-emitting surface 104 as in FIG. 3. Accordingly, as the orientation is arranged so that the first chip electrode 111 corresponds to the first substrate electrode pad 51 and the second chip electrode 112 corresponds to the second substrate electrode pad 52 by the magnetic field when performing the fluidic self-assembly, the micro LED 100 may be inserted into the mounting groove 41. In addition, the micro LED 100 may be configured such that the light-emitting surface 104 is prevented from being inserted to the mounting groove 41 in an orientation facing the bottom of the mounting groove 41 by the post 115.

The post 115 may be removed from the micro LED 100 through a separate process that is performed after the micro LED 100 is mounted to the mounting groove 41.

A thermocompression process may be carried out after the multiple micro LEDs have been transferred to the substrate 10. In this case, a metal bond state may be formed where the first and second chip electrodes 111 and 112 are respectively fused with the first and second substrate electrode pads 51 and 52 by the heat applied thereto.

A process of substituting (i.e., replacing) a faulty micro LED with a micro LED for repair will be described below.

Figure 4:
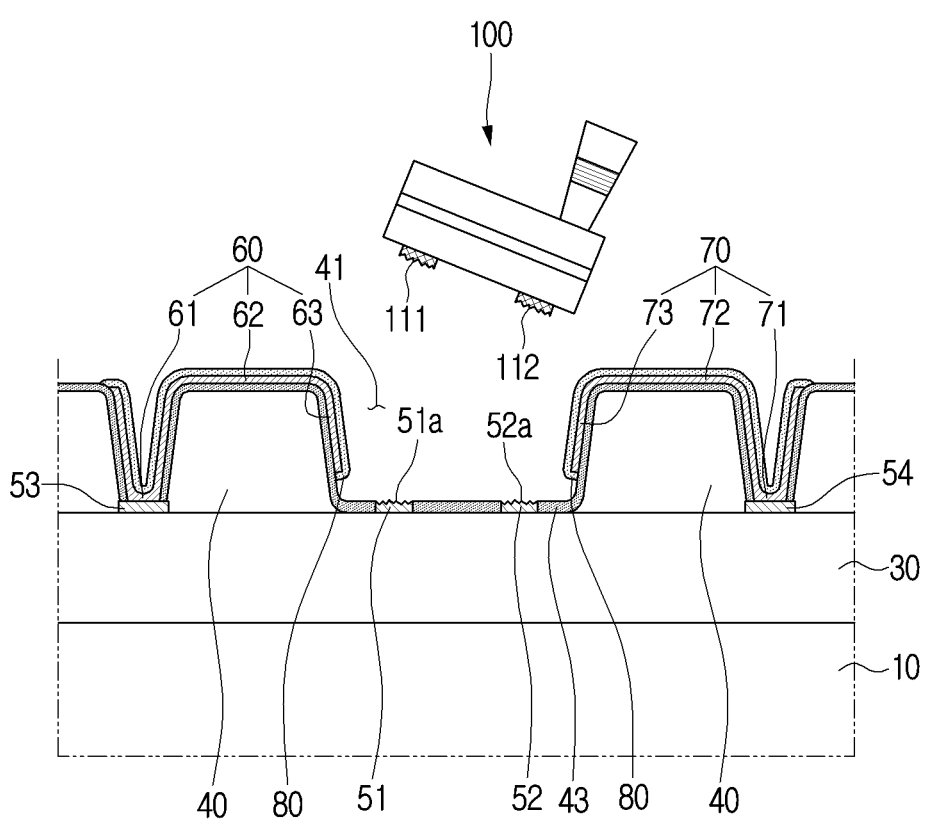
FIG. 4 is a view illustrating a faulty light-emitting device being separated from a mounting groove of a substrate according to an embodiment.
Figure 5:
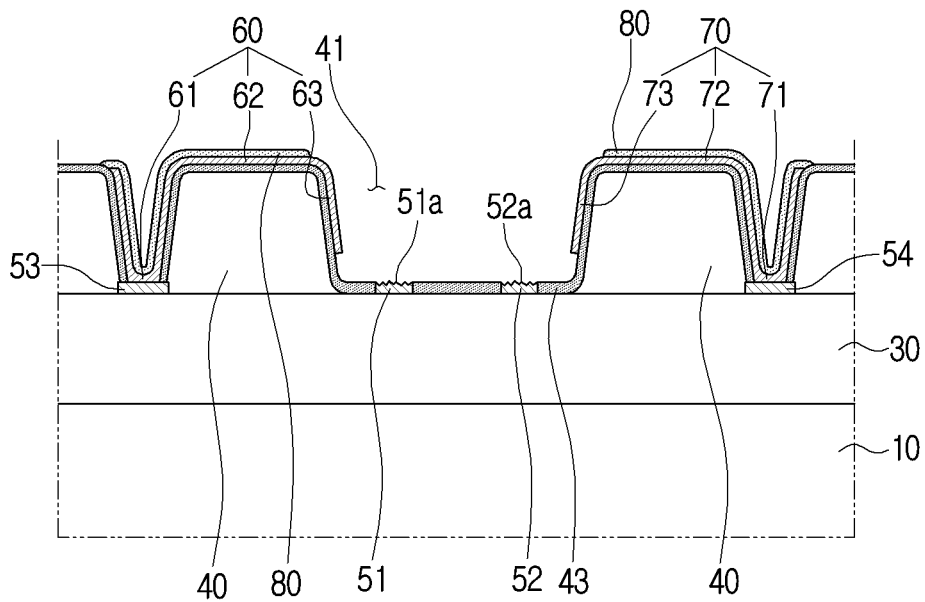
FIG. 5 is a view illustrating an insulating layer that has been removed from a portion of a third and fourth substrate electrode pads positioned at a side wall of a mounting groove of a substrate according to an embodiment.
Figure 6:
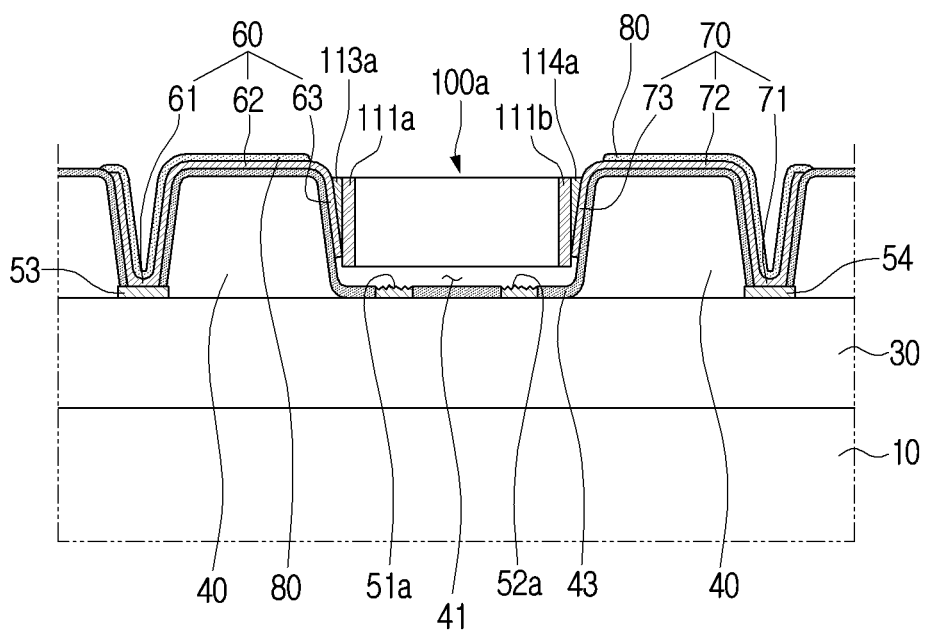
FIG. 6 is a view illustrating an example of inserting a light-emitting device for repair into a mounting groove according to an embodiment.

FIG. 4 is a view illustrating a faulty light-emitting device being separated from a mounting groove of a substrate, FIG. 5 is a view illustrating an insulating layer that has been removed from a part of an additional electrode pad positioned at a side surface of the mounting groove of the substrate, and FIG. 6 is a view illustrating an example of having inserted the light-emitting device for repair in the mounting groove.

After transferring the multiple micro LEDs to the substrate 10 through the fluidic self-assembly method, it may be determined whether or not the micro LED 100 is faulty.

For example, an Electroluminescence (EL) test may be performed while sending electricity to the substrate 10 to check for faulty micro LEDs. In this regard, a faulty micro LED will not emit light.

Referring to FIG. 4, when removing the faulty micro LED 100 from the mounting groove 41, the first and second substrate electrode pads 51 and 52 may be forcibly separated from the first and second chip electrodes 111 and 112 of the faulty micro LED 100. In this regard, a surface 51*a* of the first substrate electrode pad 51 and a surface 52*a* of the second substrate electrode pad 52 to which the first and second chip electrodes 111 and 112 were previously bonded may be damaged as in FIG. 4. Accordingly, it may not be possible to reuse the first and second substrate electrode pads 51 and 52 of the mounting groove 41.

A pre-process for mounting a micro LED 100*a* for repair of a fair quality may be carried out once the faulty micro LED 100 has been removed.

Referring to FIG. 5, the third parts 63 and 73 of the third and fourth substrate electrode pads 60 and 70 may be exposed. To this end, a part of the insulating layer 80 covering the third parts 63 and 73 of the third and fourth substrate electrode pads 60 and 70 may be removed.

Referring to FIG. 6, the micro LED 100*a* for repair may have a predetermined length, and the first and second chip electrodes 111*a* and 112*a* may be disposed at both ends.

Before inserting the micro LED 100*a* for repair in the mounting groove 41, solder pastes 113*a* and 114*a* may be applied to the third parts 63 and 73 of the third and fourth substrate electrode pads 60 and 70 with the insulating layer 80 removed.

The micro LED 100*a* for repair may be inserted in the mounting groove 41 and may be configured such that the first and second chip electrodes 111*a* and 111*b* are electrically coupled to the third and fourth substrate electrode pads 60 and 70, respectively, through the solder pastes 113*a* and 114*a*.

As described above, by providing the third and fourth substrate electrode pads 60 and 70 at the side wall and surrounding part of the mounting groove 41, the micro LED 100*a* for repair may be easily mounted to the substrate 10.

According to the position of the first and second chip electrodes 111*a* and 111*b* of the micro LED for repair, the second parts 62 and 72 or the third parts 63 and 73 of the third and fourth substrate electrode pads 60 and 70 may be selectively used. For example, based on the first chip electrode 111*a* being positioned at the side part of the micro LED and the second chip electrode 111*b* being positioned at the light-emitting surface of the micro LED, a part of the insulating layer 80 covering the third part 63 of the third substrate electrode pad 60 and the second part 72 of the fourth substrate electrode pad 70 may be used.

Figure 7:
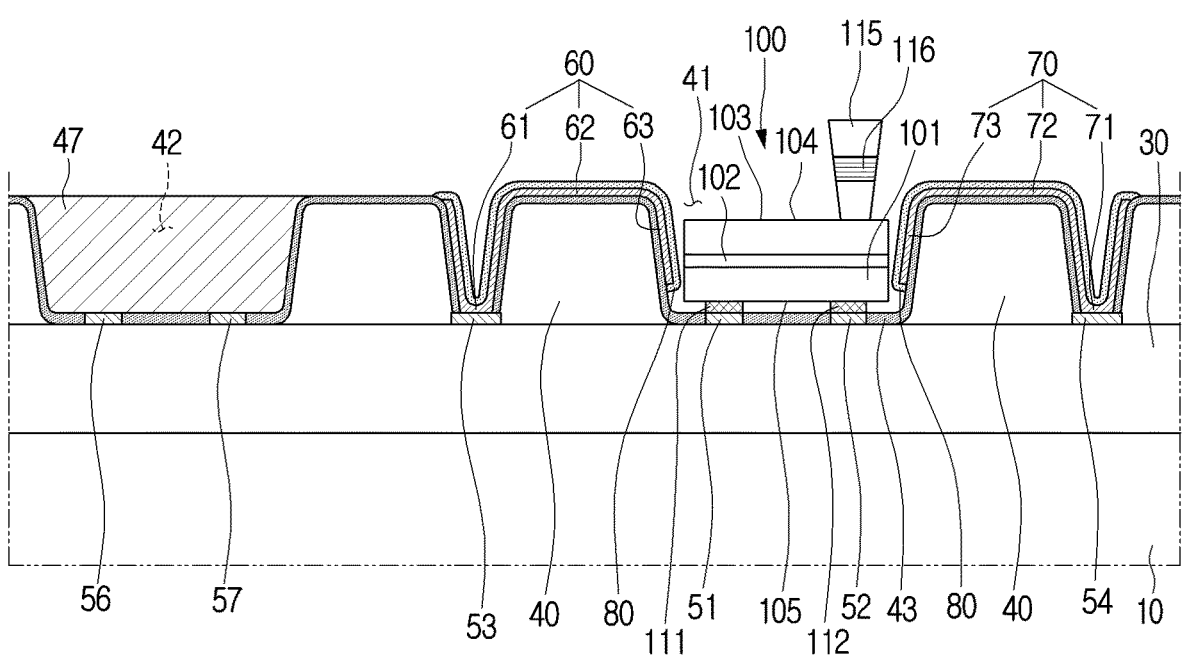
FIG. 7 is a view illustrating an auxiliary mounting groove adjacent to a mounting groove of a substrate according to an embodiment.

FIG. 7 is a view illustrating an auxiliary mounting groove formed in the insulating layer adjacent to the mounting groove.

The display module 1 applied to a large format display such as a TV may be configured such that an area of the respective pixel areas is sufficiently larger than an area of multiple sub pixels. For example, the area of one pixel area may be greater by at least three folds or more than the area of the multiple sub pixels. For example, the area of a pixel that includes three sub pixels may have an area that is three times larger than an area of the three sub pixels.

In this case, additional mounting grooves 42 corresponding to the respective mounting grooves 41 may be further provided on the substrate 10. The additional mounting groove 42 may be disposed spaced apart from the mounting groove 41. The additional mounting groove 42 may be formed in the insulating layer 40.

The additional mounting groove 42 may be configured such that a fifth substrate electrode pad 56 and a sixth substrate electrode pad 57 are disposed at the bottom of the additional mounting groove 42. In this case, the fifth substrate electrode pad 56 may be electrically coupled to the gate electrode wiring 53, and the sixth substrate electrode pad 57 may be electrically coupled to the common electrode wiring 54.

The additional mounting groove 42 may be filled with an insulator 47. The insulator 47 may be formed to have a top end that roughly corresponds to a top end of the insulating layer 80. By filling the additional mounting groove 42 with the insulator 47, the micro LED may be inserted into the mounting groove 41 and not inserted to the additional mounting groove 42, when proceeding with the initial fluidic self-assembly.

The third and fourth substrate electrode pads 60 and 70 may have a symmetrical pattern based on the center of the mounting groove 41. However, embodiments are not limited thereto, and the third and fourth substrate electrode pads 60 and 70 may have an asymmetrical pattern based on the center of the mounting groove 41.

An example of the third and fourth substrate electrode pads being disposed asymmetrically based on the center of the mounting groove will be described below-.

Figure 8:
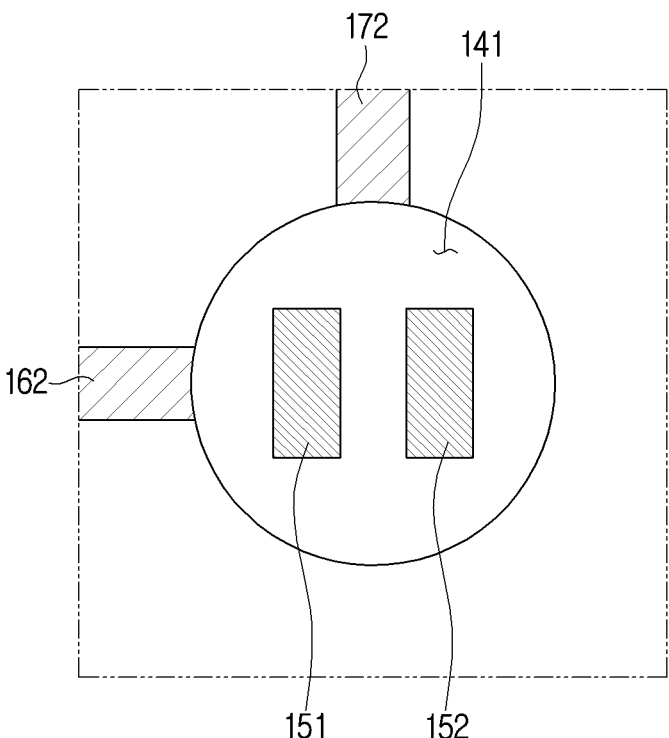
FIG. 8 is a view illustrating a pair of electrode pads formed at a mounting groove of a substrate according to an embodiment.
Figure 9:
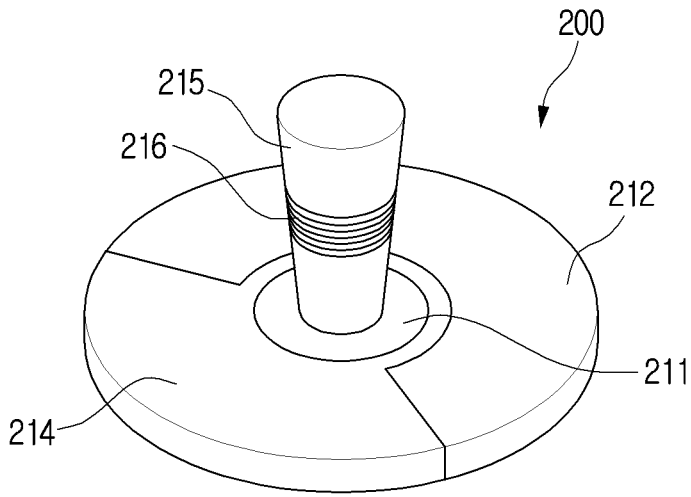
FIG. 9 is a perspective view illustrating a light-emitting device according to an embodiment.
Figure 10:
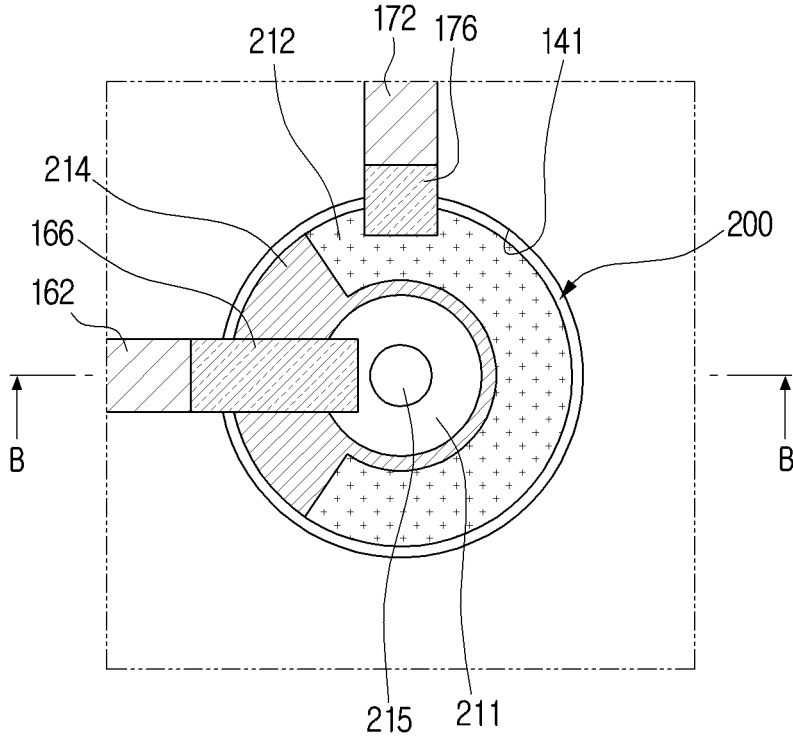
FIG. 10 is a cross-sectional view illustrating the light-emitting device shown in FIG. 9 in a mounting groove of a substrate according to an embodiment.
Figure 11:
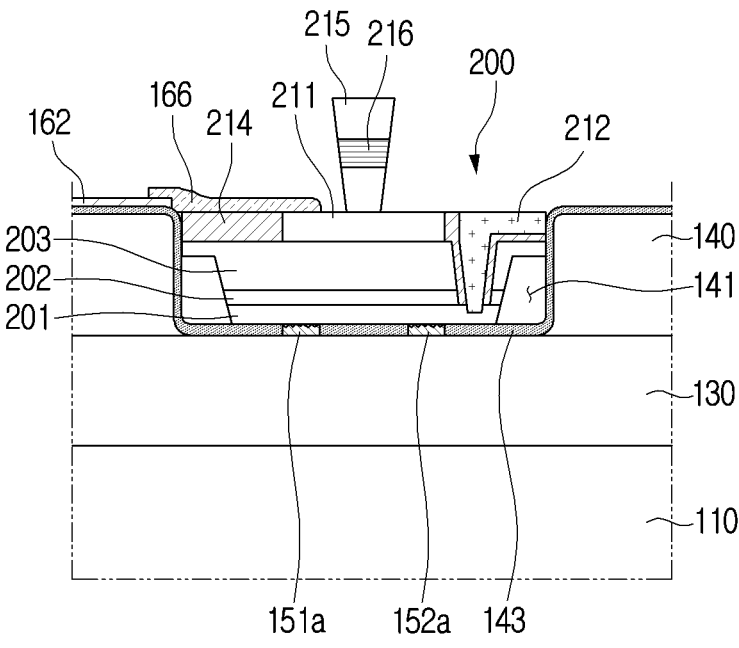
FIG. 11 is a cross-sectional view along line B-B shown in FIG. 10 according to an embodiment.

FIG. 8 is a view illustrating another example of a pair of electrode pads formed at the mounting groove of the substrate, FIG. 9 is a perspective view illustrating a light-emitting device that may be inserted into the mounting groove of the substrate shown in FIG. 8, FIG. 10 is a cross-sectional view illustrating an example of the light-emitting device shown in FIG. 9 having been inserted to the mounting groove of the substrate, and FIG. 11 is a cross-sectional view along line B-B shown in FIG. 10.

Referring to FIG. 8, a mounting groove 141 formed on the substrate may be formed roughly in a circular-shape.

The mounting groove 141 may be configured such that a first substrate electrode pad 151 and a second substrate electrode pad 152 are disposed at the bottom thereof. In this case, the bottom of the mounting groove 141 may be a top surface of the TFT layer.

The surrounding part of the mounting groove 141 may be disposed with a third substrate electrode pad 162 and a fourth substrate electrode pad 172. In this case, the third and fourth substrate electrode pads 162 and 172 may be disposed to form a rough right angle. The third substrate electrode pad 162 may be electrically coupled with the gate electrode wiring of the TFT layer, and the fourth substrate electrode pad 172 may be electrically coupled with the common electrode wiring of the TFT layer.

Referring to FIG. 9, a micro LED 200 for repair which may be inserted into the mounting groove 141 may be formed roughly in a circular-shape. The micro LED 200 for repair may be configured such that a first chip electrode 211 and a second chip electrode 212 are disposed on the light-emitting surface. For example, the first chip electrode 211 may be disposed at a center of the light-emitting surface, and the second chip electrode 212 may be disposed spaced apart from the first chip electrode 211 to surround a part of an outer circumference of the first chip electrode 211.

The micro LED 200 for repair may be configured so that a p-type semiconductor layer 201, an active layer 202, and an n-type semiconductor layer 203 are sequentially stacked. The first chip electrode 211 may be coupled to the n-type semiconductor layer 203, and the second chip electrode may be coupled with the p-type semiconductor layer 201. Insulator 214 may electrically isolate the first and second chip electrodes 211 and 212 from each other.

The micro LED 200 for repair may be configured such that a post 215 has a smaller diameter than the diameter of the first chip electrode 212, and may be disposed on the first chip electrode 212. The post 215 may include a magnetic layer 216 formed of diamagnetic materials (Diamagnetism; e.g., Ge) or materials having magnetic-field characteristics (e.g., Cr, Mn, Fe, Co, Ni, Cu).

Referring to FIG. 10 and FIG. 11, when a first substrate electrode pad and a second substrate electrode pad 151*a* and 152*a* formed at the bottom of the mounting groove 141 are damaged in the process of removing the faulty micro LED mounted to the mounting groove 141, the third and fourth substrate electrode pads 162 and 172 disposed at the surrounding part of the mounting groove 141 may be used to mount the micro LED 200 for repair in the mounting groove

141. For example, the mounting groove 141 may be formed in an insulating layer 140 that is provided on a TFT layer 130 which is provided on substrate 110. Protective film 143 may be provided on the insulating layer 140.

The micro LED 200 for repair may be inserted in the mounting groove 141 such that the first chip electrode 211 is electrically coupled with the third substrate electrode pad 162 through a first coupling wiring 166, and the second chip electrode 212 is electrically coupled with the fourth substrate electrode pad 172 through a second coupling wiring 176. The first and second coupling wirings 166 and 176 may be configured to form a right angle.

The third and fourth substrate electrode pads 162 and 172 may be covered by an insulating layer. The insulating layer may be removed when the micro LED 200 for repair is to be placed.

Embodiments have been described respectively and individually, but each embodiment may not necessarily be implemented on its own, and the configuration and operations of each embodiment may be implemented in combination with at least one other embodiment.

While embodiments have been particularly shown and described, it will be understood that various changes in form and details may be made therein without departing from the spirit and scope of the following claims.

What is claimed is:

1. A display module, comprising:
   a substrate;
   a plurality of inorganic light-emitting diodes provided in a plurality of mounting grooves formed in the substrate, the plurality of inorganic light-emitting diodes comprising an inorganic light-emitting diode that has a first chip electrode and a second chip electrode;
   a first substrate electrode pad and a second substrate electrode pad provided at a bottom surface of a mounting groove from among the plurality of mounting grooves, the first substrate electrode pad being electrically coupled to the first chip electrode and the second substrate electrode pad being electrically coupled to the second chip electrode;
   a third substrate electrode pad and a fourth substrate electrode pad provided on an insulating layer, wherein the insulating layer is provided on the substrate, and wherein the mounting groove is provided between the third substrate electrode pad and the fourth substrate electrode pad;
   a fifth substrate electrode pad and a sixth substrate electrode pad provided at a bottom surface of another mounting groove from among the plurality of mounting grooves that is adjacent to the mounting groove, the fifth substrate electrode pad being electrically coupled to the first substrate electrode pad and the sixth substrate electrode pad being electrically coupled to the second substrate electrode pad; and
   an insulator filling the another mounting groove.

2. The display module of claim 1, wherein at least one of the third substrate electrode pad and the fourth substrate electrode pad extends along a side wall of the mounting groove.

3. The display module of claim 1, wherein the third substrate electrode pad and the fourth substrate electrode pad are symmetrically provided with respect to a center of the mounting groove.

4. The display module of claim 1, wherein the third substrate electrode pad and the fourth substrate electrode pad are asymmetrically provided with respect to a center of the mounting groove.

5. The display module of claim 1, wherein the substrate comprises an insulating layer provided on the third substrate electrode pad and the fourth substrate electrode pad, and wherein the insulating layer extends in the mounting groove between the third substrate electrode pad and the bottom surface of the mounting groove.

6. The display module of claim 1, wherein the third substrate electrode pad is electrically coupled to the first chip electrode by a first conductor, and wherein the fourth substrate electrode pad is electrically coupled to the second chip electrode of the inorganic light-emitting diode by a second conductor.

7. The display module of claim 1, wherein a post is provided on a light-emitting surface of the inorganic light-emitting diode, and wherein the post comprises a magnetic layer.

8. The display module of claim 7, wherein the magnetic layer is formed of Germanium (Ge).

9. The display module of claim 7, wherein the post is offset from a center of the light-emitting surface.

10. The display module of claim 9, wherein the post is provided at a position corresponding to one of the first chip electrode and the second chip electrode.

11. A display module, comprising:

a substrate;

a thin-film transistor (TFT) layer provided on the substrate;

a plurality of mounting grooves being provided in the TFT layer;

a plurality of inorganic light-emitting diodes provided in the plurality of mounting grooves, the plurality of inorganic light-emitting diodes comprising an inorganic light-emitting diode that has a first chip electrode and a second chip electrode;

a first substrate electrode pad and a second substrate electrode pad provided at a bottom surface of a mounting groove from among the plurality of mounting grooves, the first substrate electrode pad being electrically coupled to the first chip electrode and the second substrate electrode pad being electrically coupled to the second chip electrode;

a third substrate electrode pad and a fourth substrate electrode pad provided on a side wall of the mounting groove;

a fifth substrate electrode pad and a sixth substrate electrode pad provided at a bottom surface of another mounting groove from among the plurality of mounting grooves that is adjacent to the mounting groove, the fifth substrate electrode pad being electrically coupled to the first substrate electrode pad and the sixth substrate electrode pad being electrically coupled to the second substrate electrode pad; and an insulator filling the another mounting groove, wherein the first substrate electrode pad, the third substrate electrode pad and the fifth substrate electrode pad are electrically coupled to a first electrode wiring provided on the TFT layer, and wherein the second substrate electrode pad, the fourth substrate electrode pad and the sixth substrate electrode pad are electrically coupled to a second electrode wiring provided on the TFT layer.

12. The display module of claim 11, further comprising an insulating layer covering the third substrate electrode pad and the fourth substrate electrode pad, wherein the insulating layer extends in the mounting groove between the third substrate electrode pad and the bottom surface of the mounting groove.

13. A display module comprising:

a substrate;

a plurality of mounting grooves being provided in the substrate;

a first substrate electrode pad and a second substrate electrode pad provided in a first groove of the plurality of mounting grooves;

an inorganic light-emitting diode provided in the first groove and electrically connected to the first substrate electrode pad and the second substrate electrode pad;

a third substrate electrode pad provided on the substrate and electrically connected to the first substrate electrode pad;

a fourth substrate electrode pad provided on the substrate and electrically connected to the second substrate electrode pad;

a fifth substrate electrode pad and a sixth substrate electrode pad provided in a second groove of the plurality of mounting grooves, the fifth substrate electrode pad being electrically coupled to the first substrate electrode pad and the sixth substrate electrode pad being electrically coupled to the second substrate electrode pad; and an insulator filling the another mounting groove.

14. The display module of claim 13, wherein the third substrate electrode pad is provided on an upper surface of the substrate and extends along a side wall of the first groove.

15. The display module of claim 13, wherein the third substrate electrode pad is provided on an upper surface of the substrate and extends along a side wall of the first groove and a side wall of a third groove adjacent the first groove.

16. The display module of claim 1, wherein the insulator fills the another mounting groove to a height corresponding to a surface of the substrate.

* * * * *